United States Patent [19]

Lapastora

[11] Patent Number: 5,782,399
[45] Date of Patent: Jul. 21, 1998

[54] METHOD AND APPARATUS FOR ATTACHING SPHERICAL AND/OR NON-SPHERICAL CONTACTS TO A SUBSTRATE

[75] Inventor: James Lapastora, West Warwick, R.I.

[73] Assignee: TTI Testron, Inc., Woonsocket, R.I.

[21] Appl. No.: 577,494

[22] Filed: Dec. 22, 1995

[51] Int. Cl.$^6$ ................................................. H01L 21/60
[52] U.S. Cl. .................. 228/41; 228/248.1; 29/879; 156/556
[58] Field of Search ........................ 228/33, 41, 56.3, 228/248.1, 254; 427/96; 156/277, 291, 566; 29/876, 879

[56] References Cited

U.S. PATENT DOCUMENTS

| | | | |
|---|---|---|---|
| 3,516,155 | 6/1970 | Smith | 228/56.3 |
| 5,024,372 | 6/1991 | Altman et al. | 228/254 |
| 5,118,027 | 6/1992 | Braun et al. | 228/248.1 |
| 5,135,890 | 8/1992 | Temple | 228/248.1 |
| 5,147,084 | 9/1992 | Behun et al. | 228/254 |
| 5,284,287 | 2/1994 | Wilson et al. | 228/254 |
| 5,324,569 | 6/1994 | Nagesh et al. | 228/56.3 |
| 5,439,162 | 8/1995 | George et al. | 228/180.22 |
| 5,492,266 | 2/1996 | Hoebener et al. | 228/248.1 |
| 5,627,108 | 5/1997 | Alibocus et al. | 156/277 |

*Primary Examiner*—Samuel M. Heinrich
*Attorney, Agent, or Firm*—Salter & Michaelson

[57] ABSTRACT

The method is directed to attaching spherical and/or non-spherical contacts to a substrate having mounting pads arranged in a predetermined array. The method includes the steps of positioning the substrate over a fixture, and positioning a stencil over the substrate. The stencil has openings arranged in the predetermined array, and is held and aligned by the fixture in such a position that the openings of the stencil are aligned with the mounting pads of the substrate. Soldering paste is applied onto the stencil so as to fill the openings of the stencil wherein a dab of paste is left in the openings of the stencil. Next, a contact loading plate is positioned over the substrate, the plate having openings arranged in the predetermined array. The plate is held and aligned by the fixture in such a position that the openings of the plate are aligned with the mounting pads of the substrate. The openings of the contact loading plate are then filled with contacts. Next, the contact loading plate is removed from the substrate and fixture so as to leave the contacts on the dabs of paste provided on the mounting pads of the substrate. The substrate is then heated so as to solder the contacts to the mounting pads. An apparatus for achieving the method is further disclosed.

10 Claims, 10 Drawing Sheets

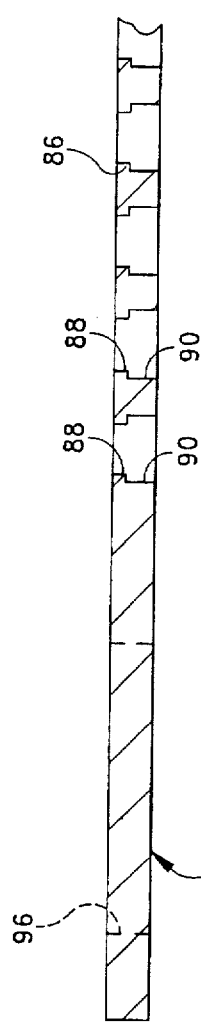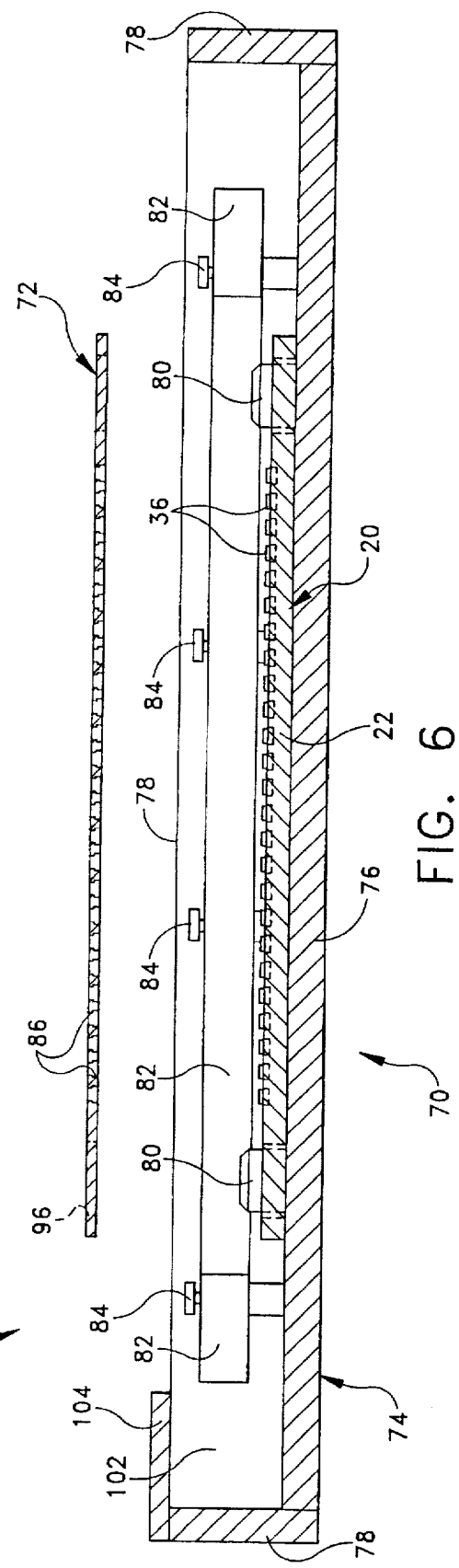

METHOD AND APPARATUS FOR ATTACHING SPHERICAL AND/OR NON-SPHERICAL CONTACTS TO A SUBSTRATE

BACKGROUND AND SUMMARY OF THE INVENTION

This invention relates generally to methods and apparatuses for attaching contacts to a substrate, and more particularly to a method for attaching spherical and/or non-spherical contacts to a substrate, such as a printed circuit or wire board of a wireless test fixture having a grid of mounting pads embedded in its upper surface.

Methods for attaching contacts to a printed circuit or wire board substrate are well-known in the art. One particular method is disclosed in U.S. Pat. No. 5,024,372 to Altman et al. In attempting to attach solder contacts or "bumps", as they are referred to in Altman et al., a thick layer of solder resist material is applied to a printed circuit board substrate wherein some of the solder resist material is selectively removed to provide wells over metallized pads which are fixedly attached to the substrate. Next, solder paste is applied to the substrate in the wells and the excess is removed by a squeegee. The solder bumps are then placed within the wells over the metallized pads and reflowed (e.g., heated) for positively bonding the solder bump to the pad. After bonding the solder bumps to the pads of the substrate, the excess solder resist material is then removed from the substrate. This method of attaching the solder contacts to the substrate is particularly representative of several of the known methods in that it is extremely time consuming to perform since the solder resist material forming the wells surrounding each metallized pad must be applied to and removed from the substrate.

In U.S. Pat. No. 5,439,162 to George et al., there is disclosed a method of attaching an integrated circuit to a printed circuit board. The method disclosed in George et al. includes the steps of depositing solder flux on contacts which are already attached to an integrated circuit, depositing solder on the contacts, engaging the contacts with the mounting pads of the printed circuit board, and heating the contacts to solder them to the pads. One problem associated with this method is that it is directed to attaching an integrated circuit having solder contacts or bumps already formed thereon with a printed circuit board rather than a method of attaching the contacts to a substrate.

U.S. Pat. No. 5,284,287 to Wilson et al. is directed to a method of attaching spherical contacts to a substrate which utilizes a tool having a vacuum mechanism for securing the contacts to the tool. More specifically, the pick-up tool has cavities which are arranged to correspond with mounting pads of the substrate. The contacts are held in place on the tool by the vacuum and are lowered into flux so that a dab of flux material is applied to each contact. The tool is then moved so as to position the contacts over the substrate, and releases the contacts from the tool onto the mounting pads of the substrate. The substrate is heated to solder the contacts thereto. This method, while being effective in attaching solder contacts to the substrate, requires complicated machinery and is expensive to implement.

The U.S. Pat. Nos. 5,118,027 to Braun et al. and 5,147,084 to Behun et al. are further representative of the prior art in this area. It should be noted that there is presently a need in the industry for a method which conveniently, expeditiously and cost-efficiently attaches spherical and non-spherical contacts onto mounting pads of the substrate.

The method of the present invention is directed to attaching spherical and/or non-spherical contacts to a substrate having mounting pads arranged in a predetermined array. The method comprises the steps of positioning the substrate over a fixture constructed and arranged for supporting the substrate thereon, and positioning a stencil over the substrate. The stencil has openings formed therein in the predetermined array, and is held and aligned by the fixture in such a position that the openings of the stencil are aligned with the mounting pads of the substrate. Soldering paste is applied onto the stencil so as to fill the openings of the stencil wherein a dab of paste is left in the openings of the stencil. The stencil is removed from the substrate so as to leave the dab of paste over each mounting pad, and a contact loading plate is positioned over the substrate. The contact loading plate has openings formed therein in the predetermined array, and is held and aligned by the fixture in such a position that the openings of the plate are aligned with the mounting pads of the substrate. The openings of the contact loading plate are then filled with contacts, the arrangement being such that the contacts engage the dabs of paste positioned over the mounting pads. Next, the contact loading plate is removed from the substrate and fixture so as to leave the contacts on the dabs of paste provided on the mounting pads of the substrate. The substrate is then removed from the fixture, and heat is applied to the substrate so as to solder the contacts to the mounting pads.

An apparatus for achieving the method of the present invention comprises a fixture, and a stencil having openings formed therein in the predetermined array. The stencil is held and aligned by the fixture in such a position that openings of the stencil are aligned with the mounting pads of the substrate. The stencil is adapted to receive thereon soldering paste so as to fill the openings of the stencil so that a dab of paste is left in the openings of the stencil. The apparatus further includes a contact loading plate having openings formed therein in the predetermined array. The contact loading plate is held and aligned by the fixture in such a position that the openings of the plate are aligned with the mounting pads of the substrate. The openings of the contact loading plate are adapted to receive contacts therein wherein the contacts engage the dabs of paste positioned over the mounting pads.

Accordingly, among the several objects of the present invention are the provision of an improved method which is capable of accurately attaching spherical and non-spherical contacts to mounting pads of a substrate; the provision of such a method which is simple to follow and easy to perform; the provision of such a method which is capable of depositing a relatively flat, disc-shaped solder preform onto the mounting pads of the substrate; the provision of such a method which incorporates easy to use and low cost equipment; the provision of such a method which reduces the amount of time normally required to solder the contacts onto the mounting pads of the substrate; and the provision of such a method which produces high-quality results.

Also among the several objectives of the present invention is that of an apparatus which achieves each of the objects of the method.

Other objects, features and advantages of the invention shall become apparent as the description thereof proceeds when considered in connection with the accompanying illustrative drawings.

BRIEF DESCRIPTION OF THE DRAWINGS

In the drawings which illustrate the best mode presently contemplated for carrying out the present invention:

FIG. 5 is a partial, enlarged, cross section, elevational view of a contact loading plate of the apparatus;

FIG. 6 is a cross section, elevational view of the contact loading plate being received by the contact loading fixture in a position where it overlies the substrate;

Corresponding reference numerals designate corresponding parts throughout the several views of the drawings.

DETAILED DESCRIPTION OF THE PREFERRED EMBODIMENT

Figure 1:
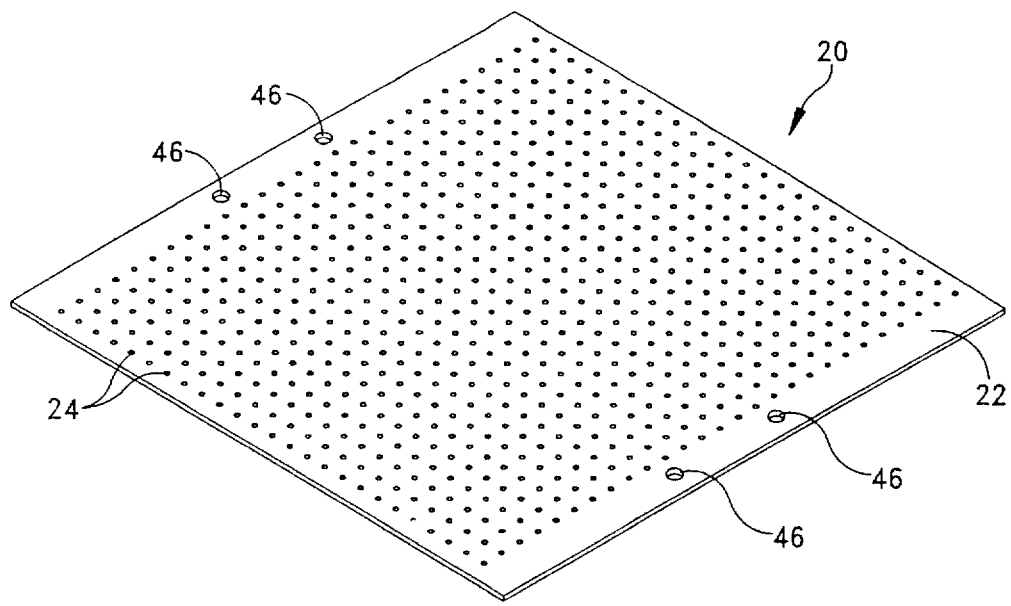
FIG. 1 is a perspective view of a substrate, such as a printed circuit or wire board.

Referring generally to the drawings, and more particularly to FIG. 1, there is generally indicated at 20 a substrate in the form of a printed circuit or wire board having a thin, rectangular body portion 22 fabricated from fiberglass or plastic material, and a plurality of disc-shaped mounting pads each indicated at 24 which are arranged in a predetermined array (e.g., a grid having rows and columns). The mounting pads 24 are made from conductive material (e.g., gold), and are embedded within the body portion 22 of the substrate 20 so that their upper surfaces are generally flush with the upper surface of the body portion 22.

Figure 7:
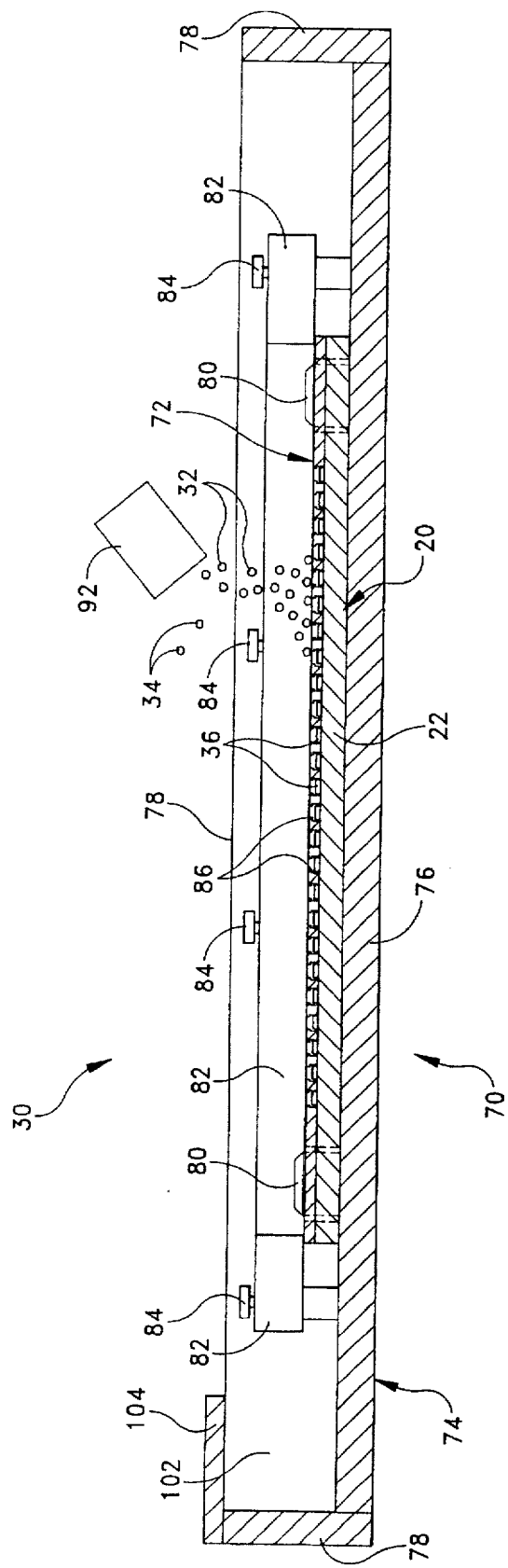
FIG. 7 is a cross-sectional view similar to FIG. 6 illustrating spherical and/or non-spherical contacts being deposited on the contact loading plate.

Turning now to FIGS. 2–14, there is generally indicated at 30 an apparatus of the present invention for attaching spherical and/or non-spherical contacts (see FIGS. 6–13) to the substrate 20. FIG. 7 illustrates spherical contacts 32 and non-spherical contacts 34 which are generally disc-shaped. The apparatus 30 is particularly designed to place a dab of solder paste 36 onto each mounting pad of the substrate (see FIG. 3), and to deposit a contact 32 or 34 onto each dab of paste 36. The arrangement is such that the substrate 20, dabs of paste 36 and contacts 32 or 34 are heated for soldering the contacts to their respective mounting pads 24 of the substrate 20. There is also disclosed herein a method for attaching the contacts 32 or 34 to the substrate 20 which will be discussed in greater detail after the description of the apparatus 30.

Figure 2:
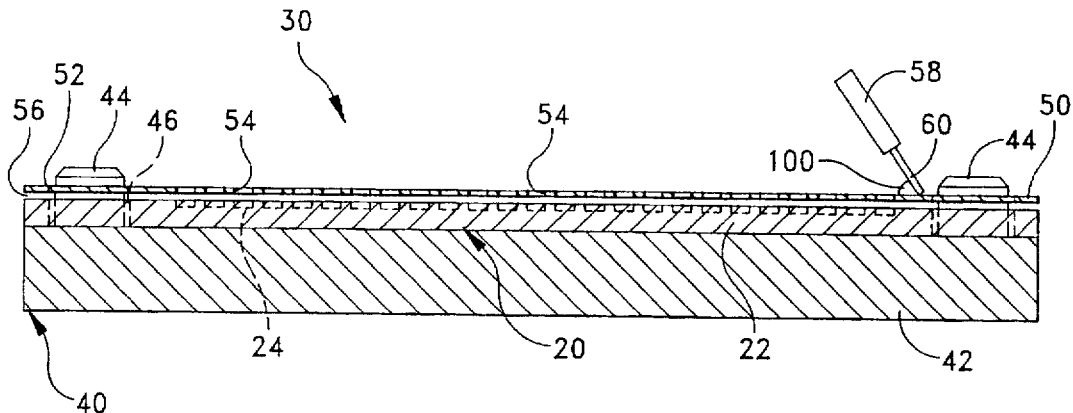
FIG. 2 is a cross section, elevational view of a stencil fixture and stencil of an apparatus of the present invention, the stencil being constructed and arranged for depositing a dab of solder paste onto mounting pads of the substrate.

Referring specifically to FIG. 2, there is generally indicated at 40 a stencil fixture of the apparatus 30 having a rectangular housing 42 and at least two, and preferably four, upwardly projecting alignment pins 44 which are suitably mounted on the housing 42. The substrate 20 has clearance openings 46 (see FIG. 1) formed in the body portion 22 which are in alignment with the pins 44, the pins 44 being received within the openings 46 of the substrate 20 when mounting it onto the stencil fixture 40 in the manner illustrated in FIG. 2.

The stencil fixture 40 and substrate 20 receive thereover a solder paste application stencil, generally indicated at 50, which has clearance openings 52 formed therein that are aligned with the clearance openings 46 of the substrate 20 and the pins 46 of the stencil fixture 40. The stencil 50 further includes a plurality of smaller openings 54 formed therein in the predetermined array. It should be understood that stencils having different patterns of openings can be provided for substrates having mounting pads arranged in a different manner, and still fall within the scope of the present invention.

The stencil fixture 40 is designed to hold and align the stencil 50 in such a position that the openings 54 of the stencil 50 are aligned with the mounting pads 24 of the substrate 20. The stencil fixture 40 is further capable of adjusting the height of the stencil 50 so that there is a gap 56 maintained between the stencil and the substrate (see FIG. 2). The gap distance is typically slightly greater than the thickness of the stencil 50. The pattern of the openings 54 of the stencil 50 is positioned over the pattern of the mounting pads 24 using positioning adjustors (not shown) located in the stencil fixture 40 which move the stencil 50 in the "X", "Y" and "Z" axis until the desired registration is achieved.

As stated above, the purpose of the stencil fixture 40 and stencil 50 is to apply the dabs of solder paste 36 to each mounting pad 24 of the substrate 20. This is accomplished with a squeegee 58 having a blade 60 which is illustrated in FIG. 2. The method of applying soldering paste to the substrate 20 will be described in greater detail during the description of the method. Preferably, the stencil 50 is fabricated from rigid yet bendable material such as plastic.

Figure 4:
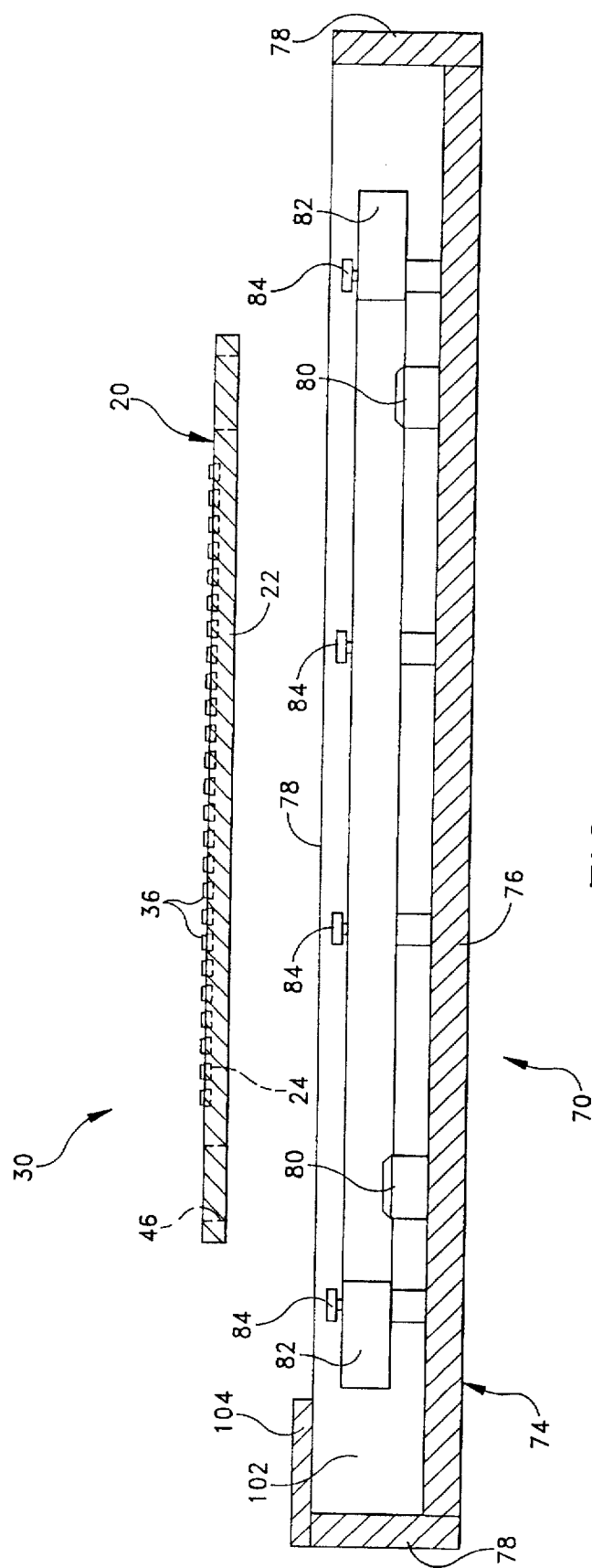
FIG. 4 is a cross section, elevational view of a contact loading fixture and the substrate being received thereon.

Turning now to FIG. 4, there is generally indicated at 70 a contact loading fixture which is designed to receive the substrate 20 thereon, and a contact loading plate which is generally indicated at 72. More specifically, the contact loading fixture 70 has a housing generally indicated at 74 in the form of a rectangular pan, the housing 74 having a bottom wall 76, and four side walls 78 which are attached to the peripheral edges of the bottom wall 76. Like the stencil fixture 40, the contact loading fixture 70 has upwardly projecting alignment pins 80 for aligning the substrate 20 and contact loading plate 72 when mounted thereon. The contact loading fixture 70 further includes four movable side rails each indicated at 82 which are attached to the bottom wall 76 of the housing 74 by thumb turn fasteners 84 for securing the substrate 20 and contact loading plate 72 in place. The side rails 82 are capable of moving laterally towards and away from the substrate 20 and contact loading plate 72, and can be locked in place for securing these components to the contact loading fixture 70.

More particularly, the side rails 82 enable the contact loading fixture 70 to adjust the registry of the plate with the mounting pads 24 of the substrate 20. This is an important feature since it is somewhat critical that the contact loading plate 72 be in registry with the mounting pads 24 of the substrate 20. As illustrated in FIG. 4, the side rails 82 are moved outwardly to allow enough clearance for the substrate 20 to be received within the contact loading fixture 70. The side rails 82 each contain slots (not shown), and the thumb turn fasteners 84 allow for their quick and easy adjustment. Once the side rails 82 are moved outwardly, the thumb turn fasteners 84 are temporarily tightened until the substrate 20 and the contact loading plate 72 are mounted on the contact loading fixture 70.

FIG. 5 is an enlarged view of the contact loading plate 72, it being fabricated from any suitable rigid material, such as rigid plastic or steel, and having openings 86 formed therein in the predetermined array. Again, as with the stencil 50, the contact loading plate 72 can have different patterns of openings which correspond to various patterns of mounting pads of different substrates. Each opening 86 has a reduced diameter portion 88 in communication with an increased diameter portion 90 or counter bore which surrounds the dab of paste 36 when the plate 72 is positioned over the mounting pad 24 of the substrate 20.

Turning to FIG. 6, the contact loading plate 72 is disposed on top of the substrate 20 with the increased diameter portions 90 facing the substrate 20. The contact loading plate 72 also has clearance openings 96 which receive the pins 80 when positioning the plate 72 over the substrate 20. Since the clearance openings 96 have a greater diameter than the fixture pins 80, there is room to adjust and register the openings 86 with the mounting pads 24 of the substrate 20. As mentioned above, the increased diameter portion 90 of each opening 86 provides clearance for the dab of solder paste 36 on the mounting pad 24 of the substrate 20. Preferably, the volume of each increased diameter portion 90 is twice the volume of the dab of solder paste 36 to allow for adequate clearance when the contact 32 or 34 displaces a portion of the dab of paste 36 when it is disposed thereover and pressed therein in a manner to be described below.

FIGS. 7-10 illustrate the contact loading fixture 70 receiving contacts (either spherical 32 or non-spherical 34) from a container 92. The manner in which the contacts 32 or 34 are disposed within the openings 86 of the contact loading plate 72 will be described in greater detail during the description of the method of the present invention. Preferably, contacts 32 or 34 are loaded onto the contact loading fixture 70 so that each opening 86 receives a contact 32 or 34 therein so that every mounting pad 24 of the substrate 20 has a contact soldered thereto.

Figure 11:
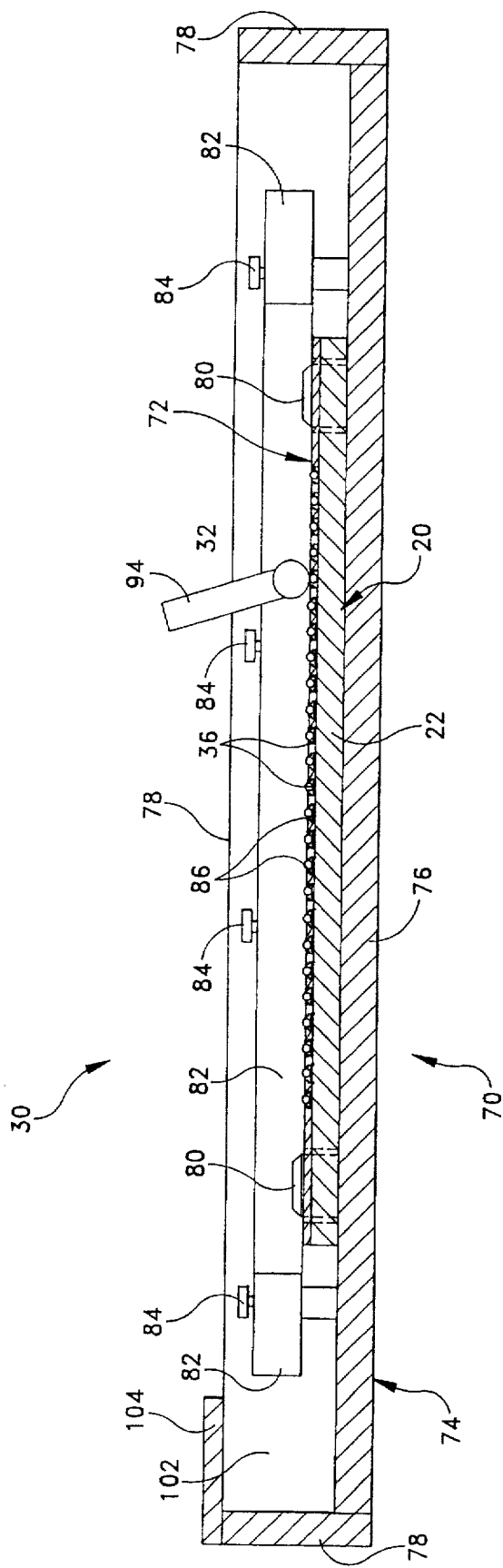
FIG. 11 is a cross-sectional view similar to FIGS. 6–10 illustrating a press tool of the apparatus applying pressure on the contacts so as to firmly seat them in their respective dabs of paste.

Turning to FIG. 11, the apparatus 30 further includes a press tool 94 which presses the contacts 32 or 34 through the reduced diameter portion 88 of the openings and into the dab of solder paste 36. As mentioned above, since the volume of the increased diameter portion 90 is roughly twice as great as the volume of the dab of paste 36, there is adequate space for firmly pressing the contact 32 or 34 within the space.

Figure 12:
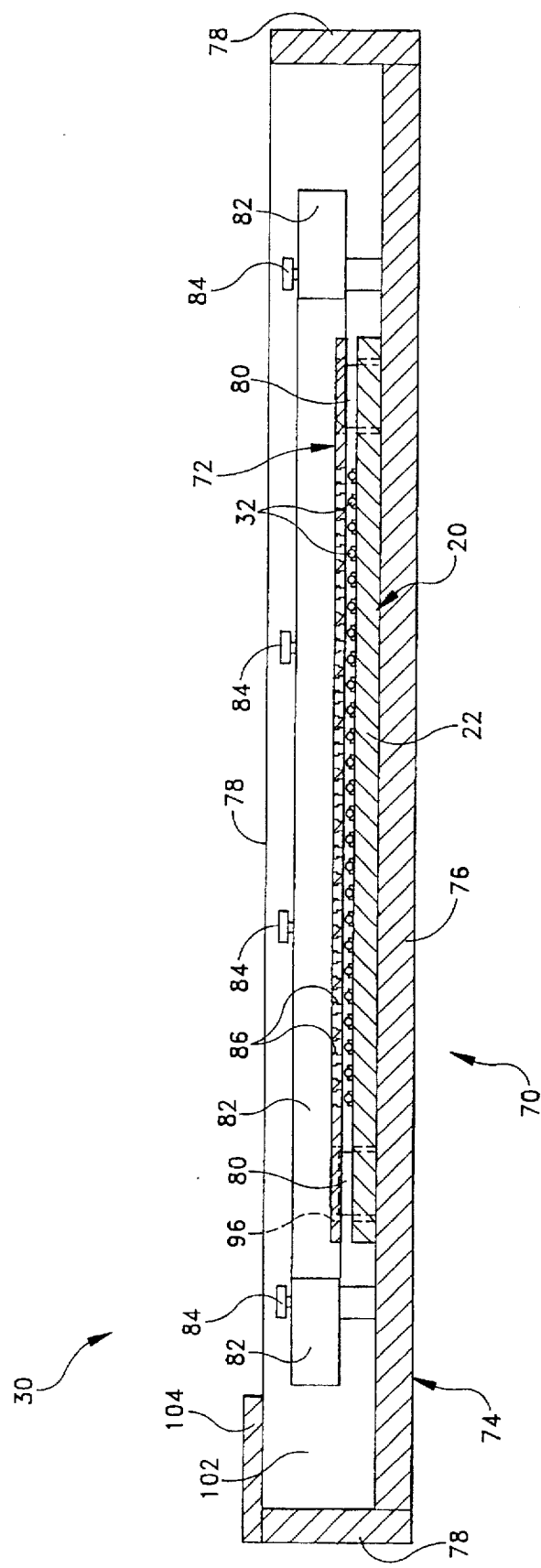
FIG. 12 is a cross-sectional view similar to FIGS. 6–11 illustrating the contact loading plate being removed from the substrate and the contact loading fixture.
Figure 13:
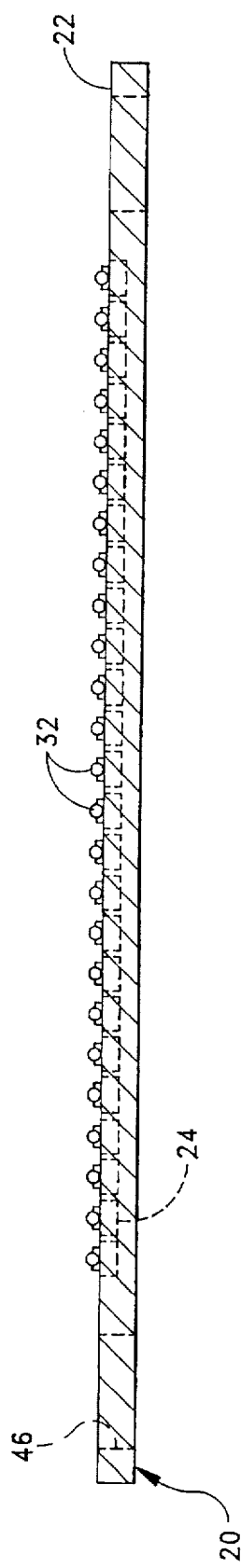
FIG. 13 is a cross-sectional cross section, elevational view of the substrate illustrating the contacts disposed on their respective dabs of paste.
Figure 14:
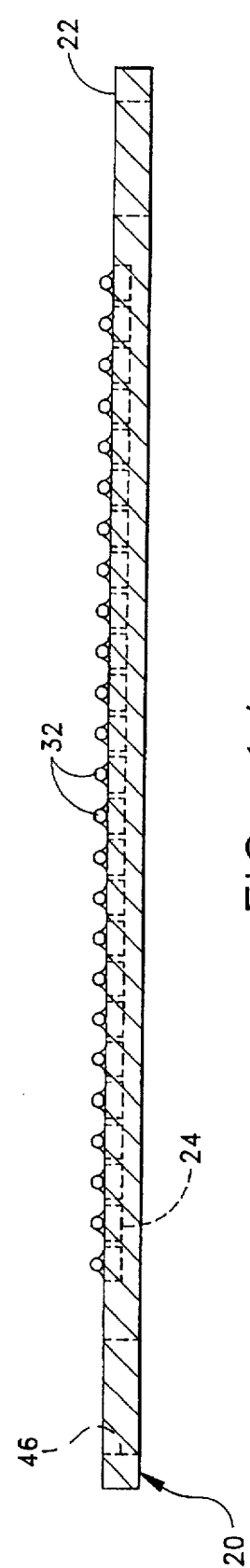
FIG. 14 is a view similar to FIG. 13 illustrating the substrate with the contacts soldered onto the mounting pads of the substrate.

FIG. 12 illustrates the contact loading plate 72 being removed from the contact loading fixture 70, and FIGS. 13 and 14 illustrate the substrate 20 before and after heat treating, respectively. It should be noted that the substrate with contacts 32 illustrated in FIG. 14 is in its finished form wherein the contacts 32 are soldered to the mounting pads 24 of the substrate 20.

The method of the present invention is as follows. First, in order to accomplish the depositing of the dabs of solder paste 36 onto the mounting pads 24 of the substrate 20, the substrate 20 is disposed over the stencil fixture 40 in such a manner that its mounting pads 24 are facing upwardly. The alignment openings 46 of the substrate 20 receive the alignment pins 44 of the stencil fixture 40 for assisting the user of the apparatus 30 in achieving this object. Next, the stencil 50 is disposed over the substrate 20 in the manner illustrated in FIG. 2 where it is in spaced relation with the substrate 20. The stencil 50 is positioned so that its openings 54 are in registry with the mounting pads 24 of the substrate 20.

The soldering paste is then applied to the stencil 50 whereby a bead of paste 100 is disposed on the top surface of the stencil 50 (see FIG. 2). This bead 100 is usually applied parallel to one edge of the stencil 50, outside of the openings 54 of the stencil 50, but with sufficient space so that the squeegee 58 can sufficiently spread the bead 100 over all of the openings 54. The squeegee 58 is positioned so that the edge of its blade 60 touches the stencil 50, and the angle of the blade 60 and the pressure applied thereto are controlled for optimal spreading of the bead 100 of soldering paste. The squeegee 58 preferably is moved at a controlled rate toward the bead of soldering paste 100 and openings 54 in the stencil 50 wherein the pressure of the squeegee 58 forces the stencil 50 to contact the top surface of the substrate 20, and the soldering paste is forced into the openings 54 of the stencil 50. The edge of the blade 60 of the squeegee 58 levels the soldering paste to make the dab of paste 36 thickness about equal to the thickness of the stencil 50. The volume of the dab of paste 36 deposited on each mounting pad 24 is closely controlled and depends on the quality of the stencil 50 and the solder paste quality during the application process. When the squeegee 58 moves sufficiently past the openings 54, the stencil 50 returns to its original height above the substrate 20. The typical process time of applying the dabs of soldering paste 36 onto the mounting pads 24 of the substrate 20 is approximately twenty minutes.

Figure 3:
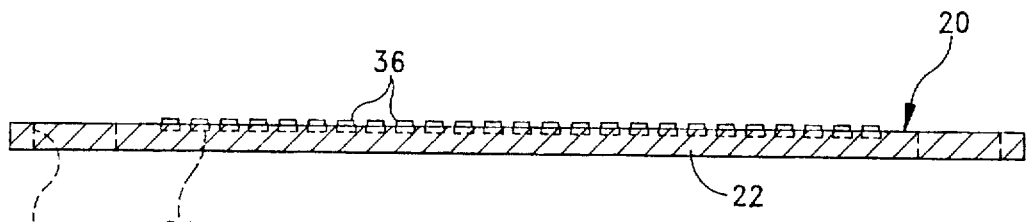
FIG. 3 is a cross section, elevational view of the substrate after the solder paste is applied thereto.

Next, the stencil 50 is removed from the substrate 20 wherein the dabs of paste 36 are left on their respective mounting pads 24 (see FIG. 3). This step takes approximately one minute.

The contact loading fixture 70 is then provided to receive the substrate 20 in the manner illustrated in FIG. 4. The contact loading fixture 70 is adjusted before the substrate 20 is mounted thereon. The adjustments include moving the four side rails 82 outwardly and tightening the thumb turn fasteners 84 temporarily until the substrate 20 and the contact loading plate 72 are mounted on the contact loading fixture 70. The alignment pins 80 of the contact loading fixture 70 assist the user in mounting the substrate 20 thereon. Next, the contact loading plate 72 is placed on top of the substrate 20 with the increased diameter portions 90 of the openings 86 facing the substrate 20 (see FIG. 6). The four side rails 82 are then moved inwardly and fastened whereby the fine registration of the contact loading plate openings 86 with the dabs of paste 36 on the mounting pads 24 can be achieved.

Figure 8:
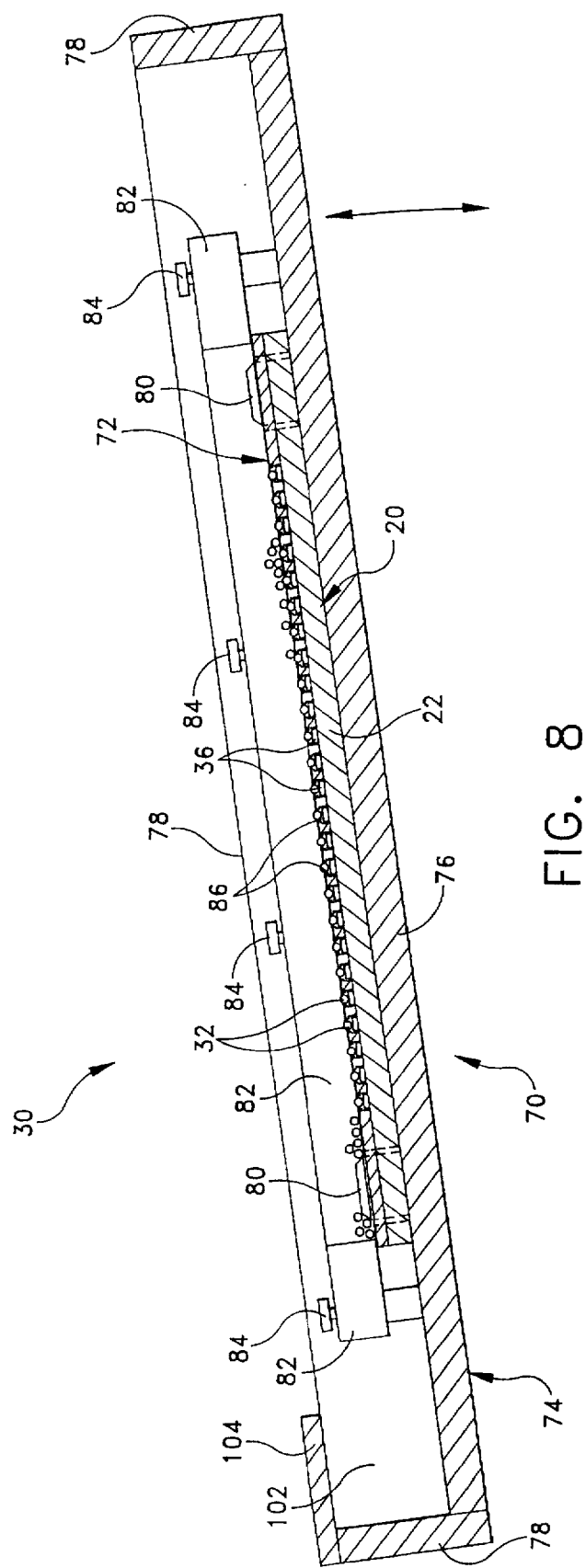
FIG. 8 is a cross-sectional view similar to FIGS. 6 and 7 illustrating the contact loading fixture being manipulated (e.g., tilted) so as to fill each opening of the contact loading plate.

Referring to FIG. 7, the contacts (e.g. contacts 32) are then poured on top of the contact loading plate 72 from the container 92. The quantity of contacts 32 poured is approximately twice the amount that will actually fill the openings 86 of the contact loading plate 72. It should be noted that the excess contacts 32 are provided for faster loading wherein they are recovered at a later time for future use. As illustrated in FIG. 8, the contact loading fixture 70 is tilted at various angles to allow the contacts 32 to roll (or slide if they are non-spherical) on the top surface of the contact loading plate 72 until they fill each opening 86. The tilt angle of the fixture 70 is controlled either by machine or by hand to prevent the contacts 32 from becoming dislodged from their openings 86. The side rails 82 of the contact loading fixture 70 prevent the excess contacts 32 from spilling out of the area defined by the contact loading plate 72. The thickness of the contact loading plate 72 is selected to allow for adequate opening depth which further assists to trap contacts 32 as they pass over the opening 86. The diameters of the openings 86 was further selected to control the exact position of the contacts relative to the substrate mounting pads 24. Using hand tilting, a substrate having 3,666 openings was filled in less than ninety seconds with spherical contacts.

Figure 9:
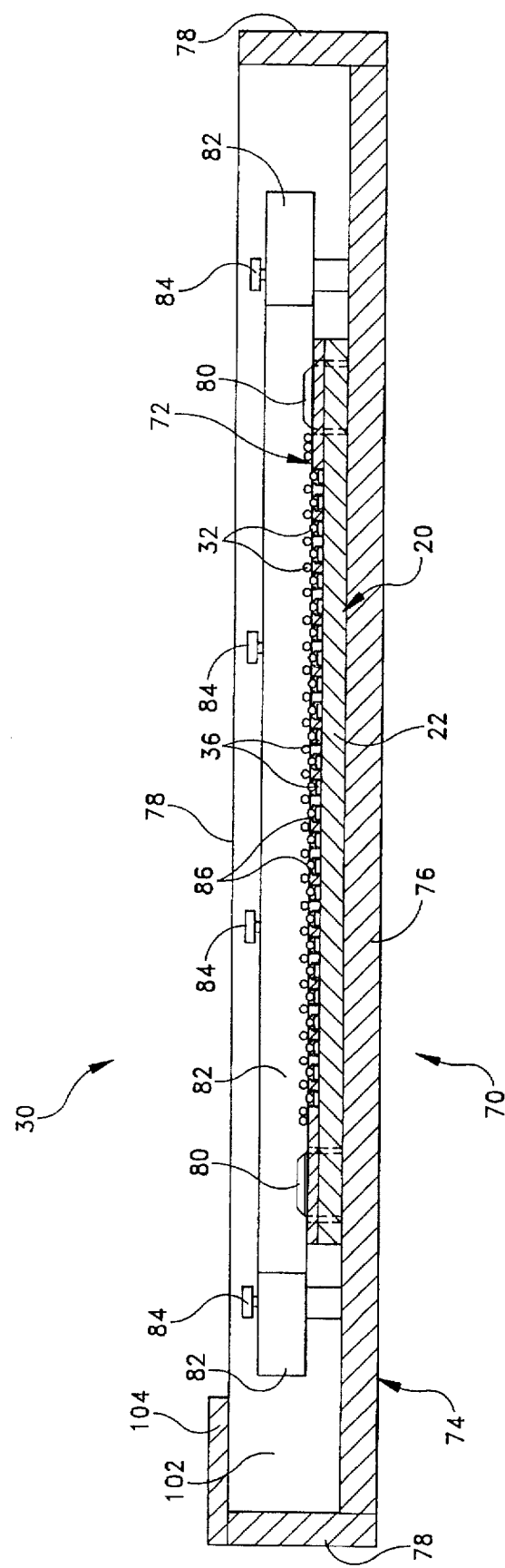
FIG. 9 is a cross-sectional view similar to FIGS. 6–8 illustrating the contact loading plate with its openings filled with contacts.
Figure 10:
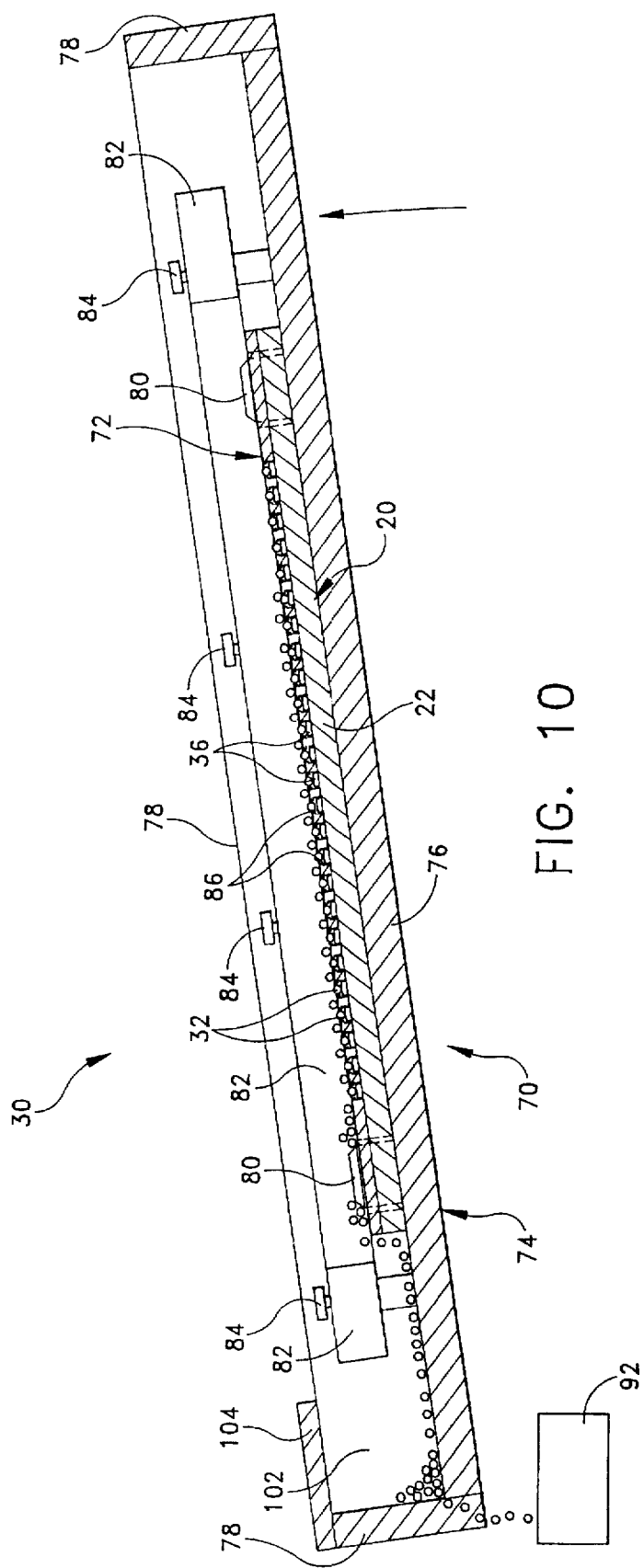
FIG. 10 is a cross-sectional view similar to FIGS. 6–9 illustrating excess contacts being removed from the contact loading fixture.

After filling each of the openings 86 of the contact loading plate 72 with contacts 32, the contact loading fixture 70 is moved back to its horizontal position as illustrated in FIG. 9, and the four side rails 82 are then moved outwardly away from the contact loading plate 72 and temporarily fastened. This allows adequate clearance between the side rails 82 and the substrate 20 and the contact loading plate 22 to allow for rapid excess contact 32 removal when the contact loading fixture 70 is again tilted. The excess contacts 32 are then removed in the manner illustrated in FIG. 10 by tilting the contact loading fixture 70 wherein they roll (or slide if non-spherical) towards the excess contact area 102 provided in the fixture 70. This area 102 is defined by the side wall 78 and a top horizontal wall 104 which enables the fixture 70 to adequately catch all of the contacts 32 when performing this step of the method. After all of the excess contacts 32 are moved to this area 102, a plug (not shown) is removed from an aperture (also not shown) formed in the housing 74 of the fixture 70, and the fixture 70 is tilted so that the excess contacts 32 escape from the aperture and spill into the container 92. This step of the method takes approximately three minutes total.

Turning now to FIG. 11, the press tool 94 presses the contacts 32 through the reduced diameter portion 90 of the openings 86 and into the dabs of solder paste 36. As mentioned above, since the volume of the increased diameter portion 90 is roughly twice as great as the volume of the dabs of paste 36, there is adequate space for firmly pressing the contact 32 within the space. This takes approximately one minute. Next, as illustrated in FIGS. 12 and 13, respectively, the contact loading plate 72 is carefully removed, and the substrate 20 is subsequently removed and inspected prior to it being heated in an oven. These two steps of the method take approximately seven minutes total.

The substrate 20 is then placed in a conveyor-type infrared oven (not shown, but well-known in the art) for soldering the contacts 32 to their respective mounting pads 24. This also takes approximately seven minutes to complete. After soldering, the substrate 20 is again inspected, and the excess flux is cleaned with an aqueous solution. The finished substrate 20 is illustrated in FIG. 14.

It should be noted that the method of the present invention quickly and efficiently achieves the difficult task of soldering contacts (whether spherical or non-spherical) to mounting pads of a substrate, and provides a significant advantage over the prior art.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. An apparatus for attaching contacts to a substrate having mounting pads arranged in a predetermined array and a plurality of openings, said apparatus comprising:

a first fixture for holding said substrate and a stencil, said first fixture having a plurality of pins arranged thereon, wherein said plurality of openings of said substrate receive said plurality of pins to hold said substrate in place;

said stencil having first openings formed therein in said predetermined array and second openings formed therein and arranged to receive said plurality of pins of said first fixture, said stencil being held and aligned by said plurality of pins of said first fixture in such a position that the openings of the stencil are aligned with the mounting pads of the substrate, said stencil being adapted to receive thereon soldering paste so as to fill the openings of the stencil so that a dab of paste is left in the openings of the stencil; and a second fixture for holding said substrate and a contact loading plate, said second fixture including a plurality of pins arranged thereon and a plurality of movable rails;

said contact loading plate having first openings formed therein in said predetermined array and second openings formed therein and arranged to receive said plurality of pins of said second fixture, said contact loading plate being adjustably held and aligned by said plurality of pins and said movable rails of said second fixture, said movable rails being adjustable so as to lock said contact loading plate in such a position that the first openings of the contact loading plate are aligned with the mounting pads of the substrate, said fire openings of the contact loading plate being adapted to receive contacts therein wherein the contacts engage the dabs of paste positioned over the mounting pads.

2. An apparatus as set forth in claim 1 further comprising a squeegee for removing excess paste from the stencil.

3. An apparatus as set forth in claim 1, said first openings formed in the contact loading plate having a reduced diameter portion in communication with an increased diameter portion which surrounds the dab of paste positioned over the mounting pad of the substrate.

4. A apparatus as set forth in claim 1 further comprising a press tool for applying pressure on said contacts so that they firmly engage their respective dabs of paste on the mounting pads of the substrate.

5. An apparatus for attaching contacts to a substrate, said substrate having a plurality of mounting pads arranged in an array and a number of alignment openings, said apparatus comprising:

a stencil having a plurality of apertures arranged in said array and a number of alignment openings, said stencil being positioned adjacent to said substrate such that said apertures of said stencil are aligned with said mounting pads of said substrate, said substrate being adapted to receive, through said apertures of said stencil, a dab of soldering paste on each mounting pad;

a contact loading fixture for holding said substrate; and a contact loading plate, said fixture having a number of alignment pins and movable rails, each of said number of alignment pins having a size and position which corresponds with a size and position of each of said alignment openings of said substrate;

said contact loading plate having a plurality of apertures arranged in said array and a number of alignment openings positioned to receive said alignment pins of said fixture and having a size slightly larger than the size of said alignment pins to allow said contact loading plate to be adjustable in a horizontal plane parallel to said substrate, thereby allowing said apertures of said contact loading plate to be aligned with said mounting pads of said substrate;

wherein said contact loading plate is adjusted such that said apertures of said contact loading plate are aligned with said mounting pads of said substrate, said movable rails are positioned and fastened to hold said contact loading plate in place relative to said substrate and each of said apertures of said contact loading plate receives a contact, each contact thereby being attached to said substrate through a respective dab of soldering paste on each mounting pad.

6. The apparatus of claim 5, further comprising a stencil fixture for holding said substrate and said stencil, said stencil fixture including alignment pins having a size and position which corresponds to the size and position of said alignment openings of said substrate and said stencil, wherein said stencil fixture holds said stencil adjacent to said substrate such that said apertures of said stencil are aligned with said mounting pads of said substrate.

7. The apparatus of claim 5, further comprising a press tool for applying pressure to said contacts so that they firmly engage their respective dabs of soldering paste on said mounting pads of said substrate.

8. The apparatus of claim 5, said contact loading fixture further comprising a basin for receiving excess contacts which are not received by said apertures of said contact loading plate.

9. The apparatus of claim 5, further comprising a squeegee for applying said soldering paste to said substrate through said apertures of said stencil.

10. The apparatus of claim 5, each of said apertures of said contact loading plate comprising a first portion having a first diameter in communication which a second portion having a second diameter, said second diameter being larger than said first diameter, wherein said second portion of each aperture surrounds a corresponding dab of soldering paste on said substrate.

* * * * *

UNITED STATES PATENT AND TRADEMARK OFFICE
CERTIFICATE OF CORRECTION

PATENT NO. : 5,782,399
DATED : July 21, 1998
INVENTOR(S) : Lapastora

It is certified that error appears in the above-identified patent and that said Letters Patent is hereby corrected as shown below:

Column 8, line 63, after "said" insert --contact loading--.

Column 9, line 4, after "said" insert --contact loading--.

Signed and Sealed this

Twenty-fifth Day of May, 1999

Attest:

Q. TODD DICKINSON

*Attesting Officer*  *Acting Commissioner of Patents and Trademarks*